United States Patent
Pinkham

(10) Patent No.: US 11,018,071 B2
(45) Date of Patent: May 25, 2021

(54) INITIATION OF ONE OR MORE PROCESSORS IN AN INTEGRATED CIRCUIT

(71) Applicant: QUALCOMM Incorporated, San Diego, CA (US)

(72) Inventor: Raymond Pinkham, San Jose, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 256 days.

(21) Appl. No.: 16/141,706

(22) Filed: Sep. 25, 2018

(65) Prior Publication Data

US 2020/0098658 A1   Mar. 26, 2020

(51) Int. Cl.
| | |
|---|---|
| *H01L 23/34* | (2006.01) |
| *G05B 15/02* | (2006.01) |
| *G05D 23/30* | (2006.01) |
| *G06F 1/10* | (2006.01) |
| *H04W 52/02* | (2009.01) |

(52) U.S. Cl.
CPC ............ *H01L 23/345* (2013.01); *G05B 15/02* (2013.01); *G05D 23/30* (2013.01); *G06F 1/10* (2013.01); *H04W 52/0209* (2013.01)

(58) Field of Classification Search
CPC ........... H05B 1/00; H05B 3/00; H01L 23/345; H01L 2924/0002; H01L 2924/00; G06F 1/10; G06F 1/00; G06F 11/24; G06F 15/00
See application file for complete search history.

(56) References Cited

U.S. PATENT DOCUMENTS

| | | | |
|---|---|---|---|
| 7,669,043 B2 | 2/2010 | Kosaka et al. | |
| 8,078,864 B2 | 12/2011 | Lin et al. | |
| 8,572,412 B1 | 10/2013 | Solt | |
| 9,075,585 B2 | 7/2015 | Dinkjian et al. | |
| 9,274,805 B2 | 3/2016 | Anderson et al. | |
| 2006/0161375 A1 | 7/2006 | Duberstein et al. | |
| 2006/0202304 A1* | 9/2006 | Orr ........................ | H01C 7/006 257/536 |
| 2009/0021085 A1* | 1/2009 | Arsovski ................. | G06F 1/206 307/117 |
| 2014/0344592 A1 | 11/2014 | Nussbaum | |

OTHER PUBLICATIONS

International Search Report and Written Opinion—PCT/US2019/046276—ISA/EPO—dated Nov. 22, 2019.

* cited by examiner

*Primary Examiner* — Brian W Jennison
(74) *Attorney, Agent, or Firm* — Kevin T. Cheatham

(57) ABSTRACT

In an aspect of the disclosure, a method, a computer-readable medium, and an apparatus are provided. The apparatus may determine whether the IC temperature is less than a threshold value. The apparatus may initiate a joule heating procedure using a joule heating element of the IC upon determining that the temperature is less than the threshold value. The apparatus may delay an initiation of the one or more processors of the IC until the IC temperature meets the threshold value.

36 Claims, 8 Drawing Sheets

INITIATION OF ONE OR MORE PROCESSORS IN AN INTEGRATED CIRCUIT

BACKGROUND

Field

The present disclosure relates generally to communication systems, and more particularly, to a process to initiate one or more processors of an integrated circuit (IC).

Background

A wireless personal area network (WPAN) is a personal, short-range wireless network for interconnecting devices centered around a specific distance from a user. WPANs have gained popularity because of the flexibility and convenience in connectivity that WPANs provide. WPANs, such as those based on short-range communication protocols (e.g., a Bluetooth® (BT) protocol, a Bluetooth® Low Energy (BLE) protocol, a Zigbee® protocol, etc.), provide wireless connectivity to peripheral devices by providing wireless links that allow connectivity within a specific distance (e.g., 5 meters, 10 meters, 20 meters, 100 meters, etc.).

BT is a short-range wireless communication protocol that supports a WPAN between a central device (e.g., a master device) and at least one peripheral device (e.g., a slave device). Power consumption associated with BT communications may render BT impractical in certain applications, such as applications in which an infrequent transfer of data occurs.

To address the power consumption issue associated with BT, BLE was developed and adopted in various applications in which an infrequent transfer of data occurs. BLE exploits the infrequent transfer of data by using a low duty cycle operation, and switching at least one of the central device and/or peripheral device(s) to a sleep mode in between data transmissions. A BLE communications link between two devices may be established using, e.g., hardware, firmware, host operating system, host software stacks, and/or host application support. Example applications that use BLE include battery-operated sensors and actuators in various medical, industrial, consumer, and fitness applications. BLE may be used to connect devices such as BLE enabled smart phones, tablets, and laptops. While traditional BLE offers certain advantages, there exists a need for further improvements in BLE technology.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Historically, complementary metal-oxide-semiconductor (CMOS) integrated circuits are designed to operate in a limited temperature range in order to ease the design complexity and limit the effort in developing libraries and custom IP at extreme temperatures. For example, an integrated circuit intended for wireless applications, e.g., a BT device, a BLE device, a Wi-Fi device, a combination device featuring Wi-fi and BT, a combination device including Wi-Fi and BLE, or a combination device including Wi-Fi and long term evolution (LTE) cellular communications, may be designed to operate reliably within ambient temperature range of 0 degrees centigrade (0° C.) and 70 degrees centigrade (70° C.). The temperature range is commonly referred to as "commercial grade" and such commercial grade integrated circuits (ICs) are not intended to operate in very harsh temperature environments.

Recently, automobiles are incorporating more and more integrated circuits for engine control, telematics, infotainment, and autonomous driving. Automotive specifications and standards such as AEQ-100 require that such integrated circuits operate reliably over a ten year life time at ambient temperatures ranging from −40° C. to 85° C. for Autograde 3 and from −40° C. to 105° C. for Autograde 2. Developing ICs to operate reliably down to −40° C. is problematic for at least the three reasons set forth below.

First, wireless ICs may operate sensitive radio frequency (RF) analog electronics that use precise calibrations. Designing ICs that may be calibrated down to −40° C. while maintaining reasonable Key Performance Indicators (KPI) (e.g., such as receive sensitivity and transmit error vector magnitude) may be difficult and sometimes impractical.

Second, it may be difficult to fashion a characterization and manufacturing test environments down to −40° C. owing to issues with frosting.

Third, the cost of developing IC cell models, memory arrays, and/or other underlying intellectual property (IP) core(s) for use in ICs may increase proportionately for every distinct temperature, process, and/or voltage corner that has to be simulated, or timing that has to be closed. Building standard IC models that are able to operate at very low temperatures (e.g., −40° C.) for low and high voltage and for slow and fast process corners adds up to four additional library "corners" that may need to be carefully and tediously characterized beyond that needed for commercial and/or industrial specifications. Characterizing additional library corners for commercial and/or industrial specifications may be undesirably costly and complex (e.g., time consuming) from a manufacturing standpoint.

There is a need to avoid characterizing ICs down to −40° C. In order to reduce the undesirable economic and complexity constraints described above, while also achieving a reliable operation across all operating modes at very low surrounding temperatures (e.g., −40° C.).

The present disclosure provides a solution by delaying an initiation procedure to boot one or more processor(s) of the IC until a joule heating procedure is implemented at one or more transistors and/or resistors and the temperature of the IC meets a threshold value (e.g., −30° C.), e.g., as described below in connection with FIGS. 1-8.

In an aspect of the disclosure, a method, a computer-readable medium, and an apparatus are provided. The apparatus may determine whether a temperature of an IC is less than a threshold value. The apparatus may initiate a joule heating procedure using a joule heating element of the IC upon determining that the temperature is less than the threshold value. The apparatus may delay an initiation of the one or more processors of the IC until the temperature meets the threshold value.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
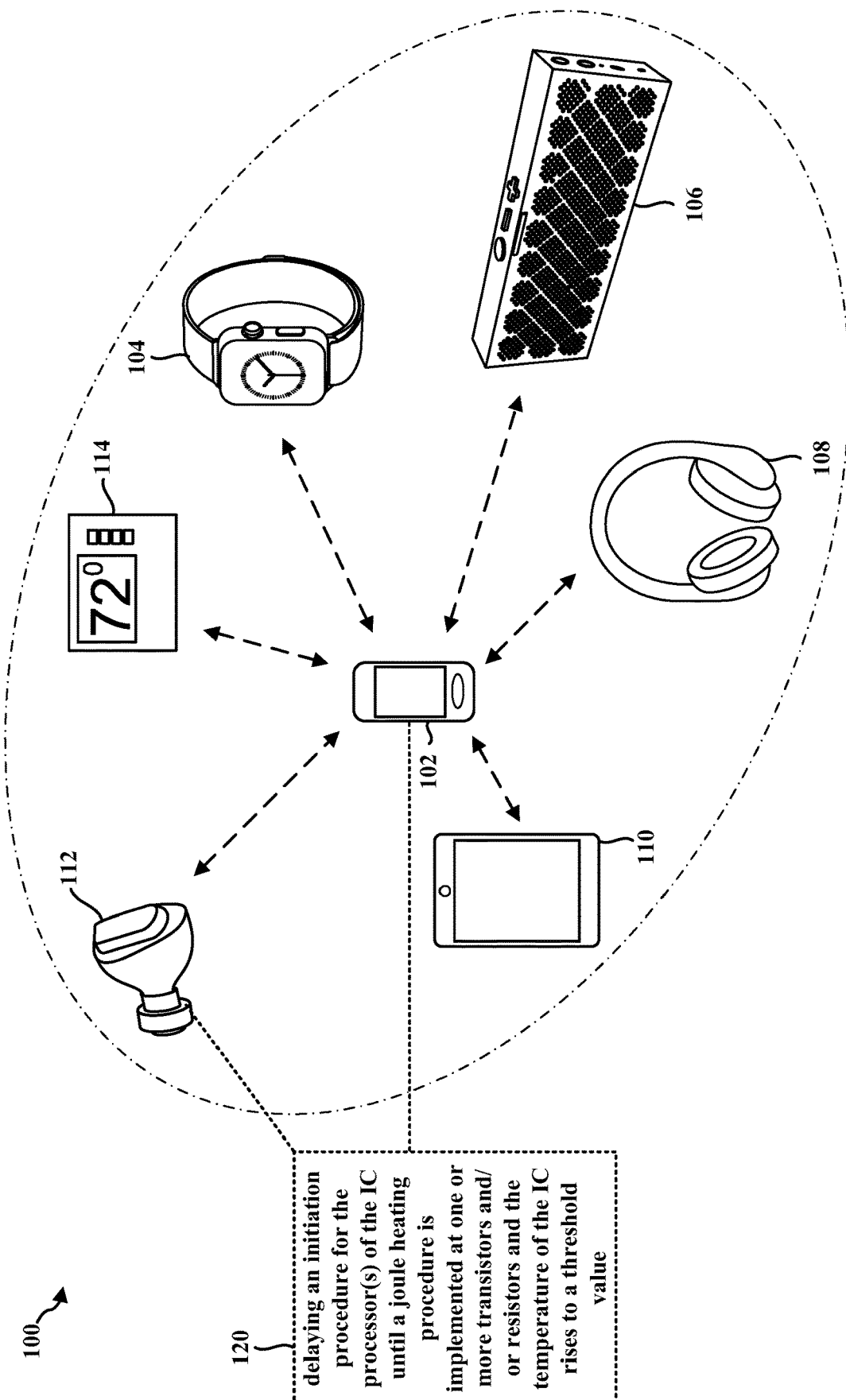
FIG. 1 is a diagram illustrating an example of a WPAN in accordance with certain aspects of the disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 illustrates an example WPAN 100 in accordance with certain aspects of the disclosure. Within the WPAN 100, a central device 102 may connect to and establish a BLE communication link 116 with one or more peripheral devices 104, 106, 108, 110, 112, 114 using a BLE protocol or a modified BLE protocol. The BLE protocol is part of the BT core specification and enables radio frequency communication operating within the globally accepted 2.4 GHz Industrial, Scientific & Medical (ISM) band.

The central device 102 may include suitable logic, circuitry, interfaces, processors, and/or code that may be used to communicate with one or more peripheral devices 104, 106, 108, 110, 112, 114 using the BLE protocol or the modified BLE protocol as described below in connection with any of FIGS. 2-8. The central device 102 may operate as an initiator to request establishment of a link layer (LL) connection with an intended peripheral device 104, 106, 108, 110, 112, 114.

A LL in the BLE protocol stack and/or modified BLE protocol stack (e.g., see FIG. 3) provides, as compared to BT, ultra-low power idle mode operation, simple device discovery and reliable point-to-multipoint data transfer with advanced power-save and encryption functionalities. After a requested LL connection is established, the central device 102 may become a master device and the intended peripheral device 104, 106, 108, 110, 112, 114 may become a slave device for the established LL connection. As a master device, the central device 102 may be capable of supporting multiple LL connections at a time with various peripheral devices 104, 106, 108, 110, 112, 114 (slave devices). The central device 102 (master device) may be operable to manage various aspects of data packet communication in a LL connection with an associated peripheral device 104, 106, 108, 110, 112, 114 (slave device). For example, the central device 102 may be operable to determine an operation schedule in the LL connection with a peripheral device 104, 106, 108, 110, 112, 114. The central device 102 may be operable to initiate a LL protocol data unit (PDU) exchange sequence over the LL connection. LL connections may be configured to run periodic connection events in dedicated data channels. The exchange of LL data PDU transmissions between the central device 102 and one or more of the peripheral devices 104, 106, 108, 110, 112, 114 may take place within connection events.

In certain configurations, the central device 102 may be configured to transmit the first LL data PDU in each connection event to an intended peripheral device 104, 106, 108, 110, 112, 114. In certain other configurations, the central device 102 may utilize a polling scheme to poll the intended peripheral device 104, 106, 108, 110, 112, 114 for a LL data PDU transmission during a connection event. The intended peripheral device 104, 106, 108, 110, 112, 114 may transmit a LL data PDU upon receipt of packet LL data PDU from the central device 102. In certain other configurations, a peripheral device 104, 106, 108, 110, 112, 114 may transmit a LL data PDU to the central device 102 without first receiving a LL data PDU from the central device 102.

Examples of the central device 102 may include a cellular phone, a smart phone, a session initiation protocol (SIP) phone, a mobile station (STA), a laptop, a personal computer (PC), a desktop computer, a personal digital assistant (PDA), a satellite radio, a global positioning system, a multimedia device, a video device, a digital audio player (e.g., MP3 player), a camera, a game console, a tablet, a smart device, a wearable device (e.g., smart watch, wireless headphones, etc.), a vehicle, an electric meter, a gas pump, a toaster, a thermostat, a hearing aid, a blood glucose on-body unit, an Internet-of-Things (IoT) device, or any other similarly functioning device.

Examples of the one or more peripheral devices 104, 106, 108, 110, 112, 114 may include a cellular phone, a smart phone, a SIP phone, a STA, a laptop, a PC, a desktop computer, a PDA, a satellite radio, a global positioning system, a multimedia device, a video device, a digital audio player (e.g., MP3 player), a camera, a game console, a tablet, a smart device, a wearable device (e.g., smart watch, wireless headphones, etc.), a vehicle, an electric meter, a gas pump, a toaster, a thermostat, a hearing aid, a blood glucose on-body unit, an IoT device, or any other similarly functioning device. Although the central device 102 is illustrated in communication with six peripheral devices 104, 106, 108, 110, 112, 114 in the WPAN 100, the central device 102 may communicate with more or fewer than six peripheral devices within the WPAN 100 without departing from the scope of the present disclosure.

Referring again to FIG. 1, in certain aspects, the central device 102 and/or a peripheral device 104, 106, 018, 110, 112, 114 may be configured to delay an initiation procedure for the processor(s) of the IC until a joule heating procedure is implemented at one or more transistors and/or resistors and the temperature of the IC reaches a threshold value (120), e.g., as described below in connection with any of FIGS. 2-8.

Figure 2:
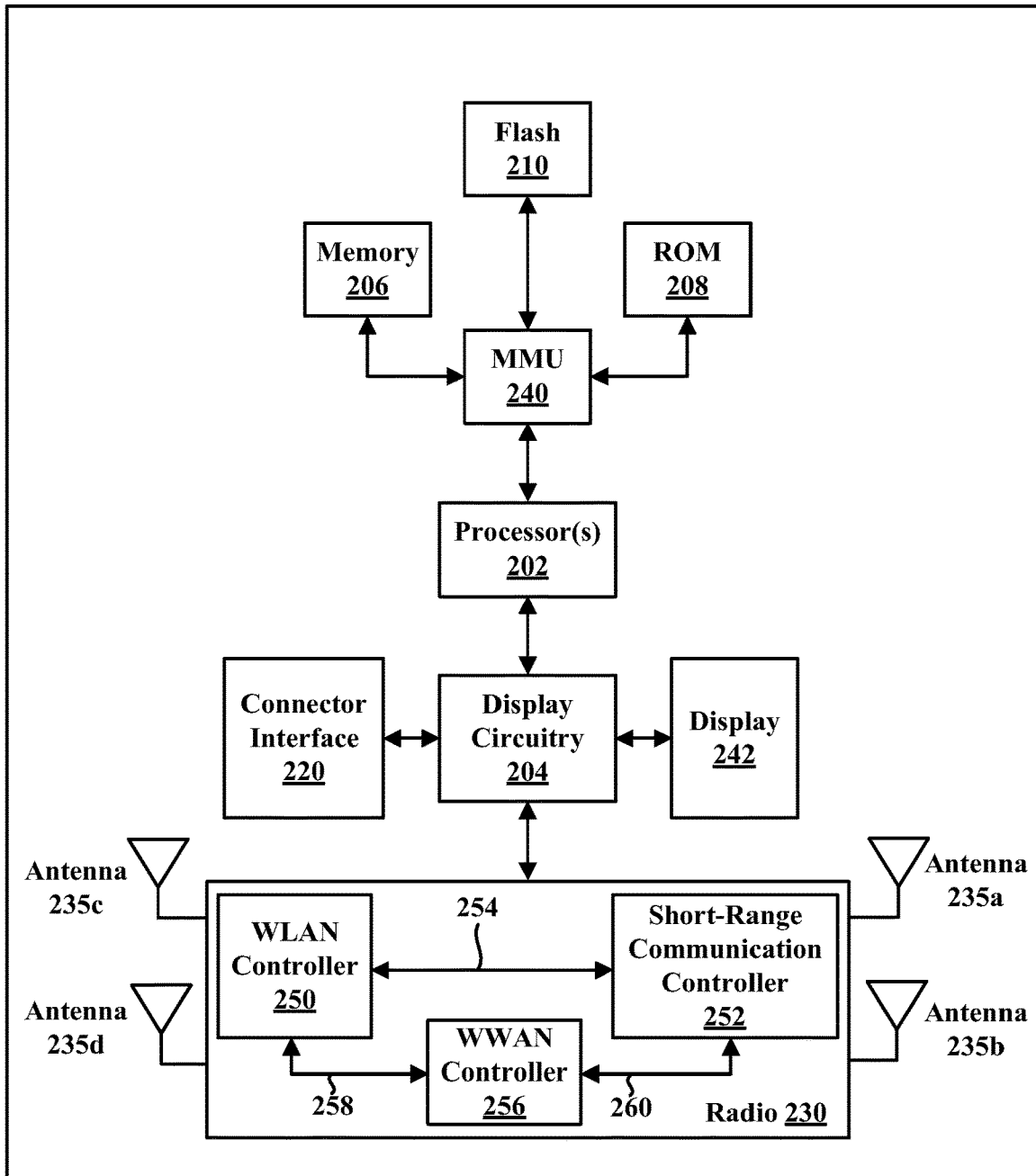
FIG. 2 is block diagram of a wireless device in accordance with certain aspects of the disclosure.

FIG. 2 is block diagram of a wireless device 200 in accordance with certain aspects of the disclosure. The wireless device 200 may correspond to, e.g., the central device 102, and/or one of peripheral devices 104, 106, 108, 110, 112, 114 described above in connection with FIG. 1. In certain aspects, the wireless device 200 may be a BLE enabled device.

As shown in FIG. 2, the wireless device 200 may include a processing element, such as processor(s) 202, which may execute program instructions for the wireless device 200. The wireless device 200 may also include display circuitry 204 which may perform graphics processing and provide display signals to the display 242. The processor(s) 202 may also be coupled to memory management unit (MMU) 240, which may be configured to receive addresses from the processor(s) 202 and translate the addresses to address locations in memory (e.g., memory 206, ROM 208, Flash memory 210) and/or to address locations in other circuits or devices, such as the display circuitry 204, radio 230, connector interface 220, and/or display 242. The MMU 240 may be configured to perform memory protection and page table translation or set up. In some embodiments, the MMU 240 may be included as a portion of the processor(s) 202.

As shown, the processor(s) 202 may be coupled to various other circuits of the wireless device 200. For example, the wireless device 200 may include various types of memory, a connector interface 220 (e.g., for coupling to the computer system), the display 242, and wireless communication circuitry (e.g., for Wi-Fi, BT, BLE, cellular, etc.). The wireless device 200 may include a plurality of antennas 235a, 235b, 235c, 235d, for performing wireless communication with, e.g., wireless devices in a WPAN.

In certain aspects, the wireless device 200 may include hardware and software components (a processing element) configured to delaying an initiation procedure for the processor(s) of the IC until a joule heating procedure is implemented at one or more transistors and/or resistors (e.g., a joule heating element) and the temperature of the IC reaches a threshold value, e.g., using the techniques described below in connection with any FIGS. 3-8. The wireless device 200 may also comprise BT and/or BLE firmware or other hardware/software for controlling BT and/or BLE operations.

The wireless device 200 may be configured to implement part or all of the techniques described below in connection with any of FIGS. 3-8, e.g., by executing program instructions stored on a memory medium (e.g., a non-transitory computer-readable memory medium) and/or through hardware or firmware operation. In other embodiments, the techniques described below in connection with any of FIGS. 3-8 may be at least partially implemented by a programmable hardware element, such as a field programmable gate array (FPGA), and/or an application specific integrated circuit (ASIC).

In certain aspects, radio 230 may include separate controllers configured to control communications for various respective radio access technology (RAT) protocols. For example, as shown in FIG. 2, radio 230 may include a wireless local area network (WLAN) controller 250 configured to control WLAN communications, a short-range communication controller 252 configured to control short-range communications, and a wireless wide area network (WWAN) controller 256 configured to control WWAN communications. In certain aspects, the wireless device 200 may store and execute a WLAN software driver for controlling WLAN operations performed by the WLAN controller 250, a short-range communication software driver for controlling short-range communication operations performed by the short-range communication controller 252, and/or a WWAN software driver for controlling WWAN operations performed by the WWAN controller 256.

In certain implementations, a first coexistence interface 254 (e.g., a wired interface) may be used for sending information between the WLAN controller 250 and the short-range communication controller 252. In certain other implementations, a second coexistence interface 258 may be used for sending information between the WLAN controller 250 and the WWAN controller 256. In certain other implementations, a third coexistence interface 260 may be used for sending information between the short-range communication controller 252 and the WWAN controller 256.

In some aspects, one or more of the WLAN controller 250, the short-range communication controller 252, and/or the WWAN controller 256 may be implemented as hardware, software, firmware or some combination thereof.

In certain configurations, the WLAN controller 250 may be configured to communicate with a second device in a WPAN using a WLAN link using all of the antennas 235a, 235b, 235c, 235d. In certain other configurations, the short-range communication controller 252 may be configured to communicate with at least one second device in a WPAN using one or more of the antennas 235a, 235b, 235c, 235d. In certain other configurations, the WWAN controller 256 may be configured to communicate with a second device in a WPAN using all of the antennas 235a, 235b, 235c, 235d. The wireless device may be configured to delay an initiation procedure for the processor(s) of the IC until a joule heating procedure is implemented at one or more transistors and/or resistors and the temperature of the IC reaches a threshold value.

Figure 3:
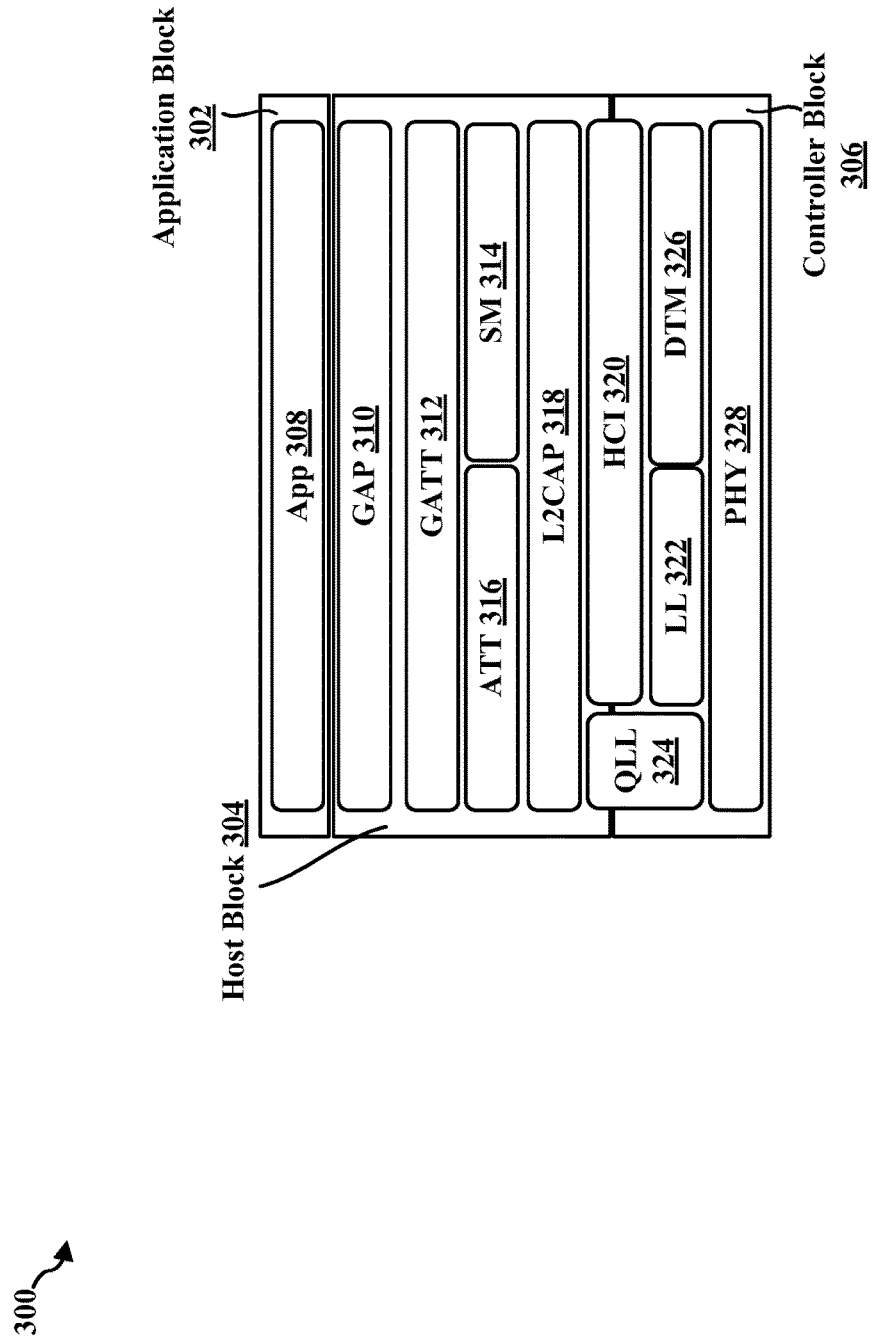
FIG. 3 is a diagram illustrating a modified BLE protocol stack in accordance with certain aspects of the disclosure.

FIG. 3 illustrates a modified BLE protocol stack 300 that may be implemented in a BLE device in accordance with certain aspects of the present disclosure. For example, the modified BLE protocol stack 300 may be implemented by, e.g., one or more of processor(s) 202, memory 206, Flash memory 210, ROM 208, the radio 230, and/or the short-range communication controller 252 illustrated in FIG. 2.

Referring to FIG. 3, the modified BLE protocol stack 300 may be organized into three blocks, namely, the Application block 302, the Host block 304, and the Controller block 306. Application block 302 may be a user application which interfaces with the other blocks and/or layers of the modified BLE protocol stack 300. The Host block 304 may include the upper layers of the modified BLE protocol stack 300, and the Controller block 306 may include the lower layers of the modified BLE protocol stack 300.

The Host block 304 may communicate with a controller (e.g., short-range communication controller 252 in FIG. 2) in a wireless device using a Host Controller Interface (HCI) 320. The HCI 320 may also be used to interface the Controller block 306 with the Host block 304. Interfacing the Controller block 306 and the Host block 304 may enable a wide range of Hosts to interface with the Controller block 306.

The Application block 302 may include a higher-level Application Layer (App) 308, and the modified BLE protocol stack 300 may run under the App 308. The Host block 304 may include a Generic Access Profile (GAP) 310, a Generic Attribute Protocol (GATT) 312, a Security Manager (SM) 314, an Attribute Protocol (ATT) 316, and a Logical Link Control and Adaptation Protocol (L2CAP) 318, each of which are described in further detail below. The Controller block 306 may include a LL 322, a proprietary LL (QLL) 324, a Direct Test Mode (DTM) 326, and a Physical Layer (PHY) 328, each of which are described in further detail below.

To support future applications (e.g., IoT applications, audio applications, etc.), the PHY 328 of the present disclosure may support an increased range of communication and data rate as compared to the PHY in a traditional BLE protocol stack. The PHY 328 may define the mechanism for transmitting a bit stream over a physical link that connects BLE devices. The bit stream may be grouped into code words or symbols, and converted to a PDU that is transmitted over a transmission medium. The PHY 328 may provide an electrical, mechanical, and procedural interface to the transmission medium. The shapes and properties of the electrical connectors, the frequency band used for transmission, the modulation scheme, and similar low-level parameters may be specified by the PHY 328.

The DTM 326 may allow testing of the PHY 328 by transmitting and receiving sequences of test packets. DTM 326 may be used in compliance and production-line testing without the need of going through the entire modified BLE protocol stack 300. In other words, the DTM 326 may skip the Host block 304 and communicate directly with the short-range communications controller of the radio (e.g., the short-range communication controller 252 and radio 230 in FIG. 2) in an isolated manner.

The LL 322 may be responsible for low level communication over the PHY 328. The LL 322 may manage the sequence and timing of transmitted and received LL data PDUs, and using a LL protocol, communicate with other devices regarding connection parameters and data flow control. The LL 322 may provide gate keeping functionality to limit exposure and data exchange with other devices. If filtering is configured, the LL 322 may maintain a list of allowed devices and ignore all requests for data PDU exchange from devices not on the list. The LL 322 may use the HCI 320 to communicate with upper layers of the modified BLE protocol stack 300. In certain aspects, the LL 322 may be used to generate a LL data PDU and/or an empty packet (e.g., empty PDU) that may be transmitted using a LL communication link established with another BLE device using the LL 322.

The QLL 324 is a proprietary protocol that exists alongside the LL 322. The QLL 324 may be used to discover peer proprietary devices, and establish a secure communication channel therewith. For example, the QLL 324 may be used to establish a QLL communication link between short-range communication controllers and/or proprietary controllers (not shown in FIG. 2) in two wireless devices, e.g., two Qualcomm® devices, two Apple® devices, two Samsung® devices, etc. The proprietary controllers in peer proprietary devices may communicate with each other using allocated channels, a control protocol, attributes, and procedures. Proprietary controllers may either establish a QLL communication link after a standard connection at the LL 322 has been established or over an advertising bearer. Once a QLL communication link has been established at the QLL 324, the proprietary controllers of two peer proprietary devices may be able to communicate with each other using a set of dedicated channels. Each service available at a proprietary controller may be associated with a particular channel number. A proprietary controller may include up to or more than, e.g., 127 different services. The services may include, e.g., firmware updates, licensing additional codes, and/or adding additional firmware components on peer devices just to name a few.

The L2CAP 318 may encapsulate multiple protocols from the upper layers into a LL data PDU and/or a QLL establishment PDU (and vice versa). The L2CAP 318 may also break large LL data PDUs and/or a QLL establishment PDUs from the upper layers into segments that fit into a maximum payload size (e.g., 27 bytes) on the transmit side. Similarly, the L2CAP 318 may receive multiple LL data PDUs and/or QLL establishment PDUs that have been segmented, and the L2CAP 318 may combine the segments into a single LL data PDU and/or a QLL establishment PDU that may be sent to the upper layers.

The ATT 316 may be a client/server protocol based on attributes associated with a BLE device configured for a particular purpose (e.g., monitoring heart rate, monitoring temperature, broadcasting advertisements, etc.). The attributes may be discovered, read, and written by other BLE enabled devices. The set of operations which are executed over ATT 316 may include, but are not limited to, error handling, server configuration, find information, read operations, write operations, queued writes, etc. The ATT 316 may form the basis of data exchange between BLE devices.

The SM 314 may be responsible for device pairing and key distribution. A security manager protocol implemented by the SM 314 may define how communications with the SM of a counterpart BLE deice are performed. The SM 314 may provide additional cryptographic functions that may be used by other components of the modified BLE protocol stack 300. The architecture of the SM 314 used in BLE may be designed to minimize recourse requirements for peripheral devices by shifting work to a central device. The SM 314 provides a mechanism to not only encrypt the data but also to provide data authentication.

The GATT 312 describes a service framework using the attribute protocol for discovering services, and for reading and writing characteristic values on a counterpart BLE device. The GATT 312 interfaces with the App 308 through the App's profile. The App 308 profile defines the collection of attributes and any permission associated with the attributes to be used in BLE communications. One of the benefits of BT technology is device interoperability. To assure interoperability, using a standardized wireless protocol to transfer bytes of information may be inadequate, and hence, sharing data representation levels may be needed. In other words, BLE devices may send or receive data in the same format using the same data interpretation based on intended device functionality. The attribute profile used by the GATT 312 may act as a bridge between the modified BLE protocol stack and the application and functionality of the BLE device (e.g., at least from a wireless connection point of view), and is defined by the profile.

The GAP 310 may provide an interface for the App 308 to initiate, establish, and manage connection with counterpart BLE devices.

ICs may be encapsulated in a housing and then included in a, e.g., a wireless device for use in connecting to circuit boards. Such housing very widely in form factor and material composition, but a common characteristic is that there may be some encapsulation material (e.g., plastic) included in the package that embeds the IC for protection and holding internal connections from the pads of the IC to the electrical contacts (e.g. pins or metallic balls) that protrude from the package in order to make electrical contact to an IC.

The packages may have an inherent thermal resistance that results in a temperature gradient between the surrounding "ambient" air and the transistor junctions on the IC ("junctions") during normal operation of the IC. Such a temperature gradient may be referred to as "joule heating." Joule heating may be caused by a power dissipation of the IC that is transformed into heat. The heat may be limited by the package from radiating into the surrounding air. In other words, the package may trap heat generated by joule heat, which may result in the junction temperature of the IC reaching or exceeding the temperature of the surrounding air. The more power dissipated by the IC, the hotter the IC may become relative to the surrounding air. The surrounding air may be referred to as ambient air and the temperature of the surrounding air may be referred to as ambient temperature and represented as $T_a$. Analogously, the temperature of the source and drain junctions of the transistors on the IC may be referred to as junction temperature and may be represented as $T_j$. The thermal resistance of the package, e.g., the propensity to trap heat (e.g., the thermal resistance of the package) due to joule heating, may be represented as $\Theta_{ja}$.

The junction temperature $T_j$ may be calculated from the ambient temperature $T_a$, the thermal resistance of the package $\Theta_{ja}$, and the steady state power dissipation P of the IC according to equation 1 set forth below.

$$T_j = T_a + P \times \Theta_{ja} \qquad \text{equation 1}$$

In other words, ICs containing multiple high power radios such as wireless devices, may operate at significantly higher power levels than non-wireless devices and therefore operate at a higher junction temperature than the ambient temperature as compared to non-wireless devices. For example, if the ambient temperature is −40° C., the thermal resistance of the package is 25° C. per Watt, and the "steady state" power dissipation is 1 Watt, then the junction temperature $T_j$ may be represented as equation 2 set forth below.

$$T_j = -40°\text{ C.} + 1\text{ W} \times 25\text{ C/W} = -15\text{ C.} \qquad \text{equation 2}$$

Steady state power dissipation may refer to an IC operating at a specific power level for a certain period of time. If the power level of the IC changes abruptly, there may be a latency period (e.g. seconds) until the junction temperature reaches a new steady state value as the package slowly allows heat to dissipate to the surrounding air.

The latency period may relate to an automotive electronics application known as "cold start". With respect to a cold start, suppose that a car has been parked in a very frigid region (e.g., Alaska) where the ambient temperature may be, e.g., −40° C. during certain months of the year. In addition, suppose that a driver starts the car which causes the IC depicted by the block diagram of FIG. 4 to power on. When the IC powers on, both the ambient temperature and the junction temperature of the IC may be −40° C. since there has been zero time for the junction temperature to rise due to power dissipation. Hence, when the IC is initially powered on, the IC may initiate a reset and boot sequence starting at −40° C. The reset circuitry (not illustrated in FIG. 4) may be responsible for powering on power rails (e.g., by a joule heating element such as the Heater Logic and Resistors 406) and critical clocks inside the IC before then handing off to the Boot Logic 418, which may perform boot sequence for the one or more processors of the IC. The boot sequence generally involves one or more microprocessors fetching code and reading or writing from memories. The time to service memory requests often determines the performance of the IC. Hence, the operations generally stimulate the most time critical paths on the IC. In other words, the reset circuitry may need to operate at −40° C., the boot circuitry may need to operate reliably at −40° C., or the temperature may need to reach a threshold value (e.g., −30° C.) prior to executing the boot sequence in order to ensure that the boot circuitry is able to operate reliably.

However, enabling the boot circuitry to operate reliably at, e.g., −40° C. may be problematic for at least the reasons set forth above in the Summary. Hence, there is a need to warm the IC to a temperature (e.g., threshold value) at which the boot circuitry may operate reliably prior to initiating a boot sequence of the one or more processors, e.g., as described below in connection with any of FIGS. 4-8.

Figure 4:
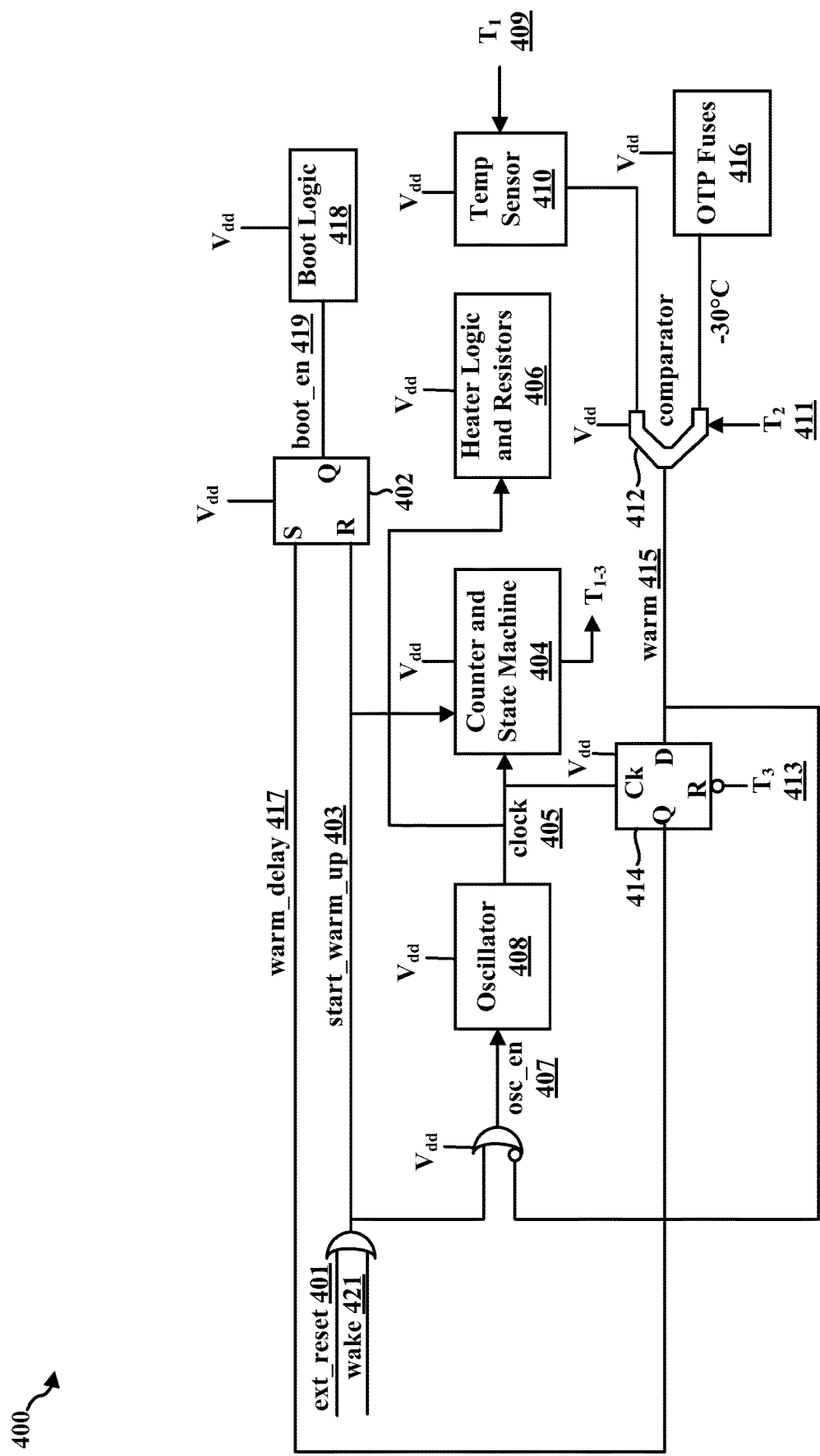
FIG. 4 illustrates a block diagram of an IC that may be configured to delay an initiation procedure for one or more processors of an IC until a joule heating procedure is implemented in accordance with certain aspects of the disclosure.

FIG. 4 illustrates a block diagram 400 of an IC that may be configured to delay an initiation procedure for one or more processors of the IC until a joule heating procedure is implemented in accordance with certain aspects of the disclosure. The IC depicted in the block diagram 400 of FIG. 4 may be included in, e.g., the central device 102, peripheral device 104, 106, 108, 110, 112, 114, wireless device 200, the apparatus 702/702'.

With reference to FIG. 4, suppose the IC is dormant (e.g., low power mode) and/or completely powered down, and hence, the temperatures $T_a$, $T_j$ may be at −40° C., which is the cold value. The cold value of −40° C. described in connection with FIG. 4 is used as an example and should not be construed in a limiting sense. Instead, the cold value may be any practical value of interest according to some design requirement.

At some point, the external reset (ext_reset) signal 401 may be asserted. The example illustrated in FIG. 4 uses the ext_reset signal 401 as the first signal precipitating a response (e.g., initiating the joule heating procedure) from the IC, but a similar example may be described using a wake signal 421 to take the underlying IC out of sleep mode. Any event that causes the IC to transition from a low power state or dormant state when the junction temperature is at or below −40° C. (e.g., as determined by the comparator 412) to a high power state (e.g., eventually a fully operation state when one or more processors of the IC are booted on) that causes the temperature to rise to or above the threshold value (e.g., −30° C.) may be considered a response from the IC. The threshold value of −30° C. is also used as an example in the description of FIG. 4 and should not be construed in a limiting sense. The threshold value may be any practical value of interest.

The start_warm_up signal 403 may be asserted high, which may force the SR flip flop 402 to hold in reset, and therefore, the boot procedure enabled (boot_en) signal 419 to remain low until the IC reaches the threshold value of −30° C. The start_warm_up signal 403 assertion may enable the Counter and State Machine 404 to transition from a reset mode to an operational mode. The Counter and State Machine 404 may include finite circuitry specially designed to operate down to −40° C. The clock signal 405 may be relatively slow such that no set-up timing violations may occur. Alternatively, the Counter and State Machine 404 may be designed using both phases of the clock signal 405 in order to avoid hold time violations.

The oscillator enable (osc_en) signal 407 may be asserted in order to initiate the free-running oscillator 408 that may generate a clock signal 405. The clock signal 405 may be input to the Heater Logic and Resistors 406 and to the Counter and State Machine 404. The Heater Logic and Resistors 406 may include digital logic, refractory metal or polysilicon resistors, or other electronic elements, all of which dissipate power responsive to the clock (not illustrated in FIG. 4). In the case of digital logic, the power dissipation may be given by equation 3 set forth below, where P is power dissipation, C is the capacitance of the load on the digital logic signals, V is voltage, and F is the frequency of the clock.

$$P=CV^2F \qquad \text{equation 3}$$

In certain implementations, the Heater Logic and Resistors 406 may also contain resistors that carry a DC current. In implementations in which the Heater Logic and Resistors 406 include resistor s that carry a DC current, the Heater Logic and Resistors 404 may enable an enable signal (not illustrated in FIG. 4) for the DC current while clock is active. In such an implementation, the power dissipation may be represented by equation 4 set forth below, where P is power dissipation, I is the current, and R is the resistor value. In other words, once the clock is initiated, the Heater Logic and Resistors 406 may begin dissipating power in order to raise the junction temperature of the IC. The amount of power dissipated may be designed to achieve or exceed the threshold value, e.g., in this case −30° C. For example, if the IC needs to raise the junction temperature from −40° C. to −30° C., and the IC has a thermal resistance of 25° C./Watt, the IC may be designed to dissipate a minimum power described below in equation 4.

$$P=(T_j-T_a)/\Theta_{ja}=10/25=0.4 \text{ Watts} \qquad \text{equation 4}$$

The Counter and State Machine 404 may be consecutively clocked and may generate, in a predetermined sequence, control signals $T_1$ 409, $T_2$ 411, and $T_3$ 413. The exact number of clock periods between assertions of $T_1$ 409, $T_2$ 411, and $T_3$ 413 may be up to the discretion of the designer.

In certain configurations, $T_1$ 409 may be asserted to enable the temperature sensor 410. The temperature sensor 410 may include circuitry that monitors the junction temperature of the IC. The single temperature sensor 410 described in connection with FIG. 4 is used as an example and should not be construed in a limiting sense. For example, there may be a plurality of temperature sensors in the IC, and the lowest temperature value may be passed to the input of the temperature comparator 412 by each of the temperature sensors. The threshold value (e.g., −30° C.) input to the temperature comparator 412 may be pre-programmed (e.g., during manufacture of the IC) in the One-Time-Programmable (OTP) storage or fuses 416. The threshold value may represent the warmer temperature, which is −30° C. in the example described in connection with FIG. 4.

In certain configurations, when $T_2$ 411 is asserted to enable the temperature comparator 412, the output of the temperature comparator 412 may be de-asserted low (e.g., meaning not warm) prior to the assertion of $T_2$ 411.

In certain configurations, when $T_3$ 413 is asserted, the D flip flop 414 may be reset in order to enable the Q output of the SR flip flop 402 to eventually change states when the warm signal 415 is asserted high.

At this point, the IC illustrated in FIG. 4 may wait for the junction temperature to reach or exceed the threshold value of −30° C., which may be detected by the temperature sensor 410. The output of the temperature sensor 410 may indicate the junction temperature to the temperature comparator 412. Eventually, the junction temperature may reach or exceed the threshold value of −30° C., and the temperature comparator 412 may assert the warm signal 415 upon determining that the junction temperature meets or exceeds the threshold value.

One clock cycle later, the warm delay (warm_delay) signal 417 may be asserted. Waiting for a clock cycle to expire prior to asserting the warm_delay signal 417 may be beneficial in that a temporal buffering to the warm signal 415 in anticipation of race conditions may be provided. The warm_delay signal 417 may be omitted in certain operations that do not involve race conditions. Race conditions occur when two or more signals change state in a way that creates an undesirable condition. A classic case is when two signals A and B are input to an AND gate such that A is initially high and B is initially low at the end of a clock cycle, just before the next clock event. The next clock event may cause logic to transition signal A to go low and signal B to go high. If signal A goes low before signal B goes high, the output of the AND gate will remain low. However, if signal A goes low after signal B goes high, the output of the AND gate will temporarily go high, such event is known as a "glitch". The glitch is a form of race condition in that signal B undesirably raced ahead of signal A. If the glitch is received by a circuit which acts unconditionally and unrevokably upon the glitch (e.g., by activating an asynchronous reset circuit), undesirable circuit operation could result. To avoid an undesirable circuit operation, flip flops are generally deployed such that such reset signals may be generated directly from the output of a flip flop with no intervening logic. In such manner, signals A and B can change in any order so long as they settle before the next edge of the clock such that the output of said AND gate has settled (in this case low). At the next edge of the clock, the output of the flip flop may remain low since the output of the AND gate was settled low at the time of the clock edge. Thus no glitch, or race condition, occurs at the output of the flip flop and (by way of this example) no glitch occurs on the asynchronous reset signal.

The warm_delay signal 417 may be input to the Set (S) input of the SR flip flop 402. The SR flip flop 402 may be designed such that the Q output (e.g., the boot_en signal 419) to cause a transition from a zero to a one when warm_delay signal 417 goes high and start_warm_up signal 403 goes low. The start_warm_up signal 403 may go low when the ext_reset signal 401 is de-asserted (e.g., goes low). The ext_reset signal 401 may be de-asserted to signal to the CPU (not illustrated in FIG. 4) to retrieve the boot vector that is used to implement the Boot Logic sequence for the one or more processors of the IC by the Boot Logic 418. In other words, the Boot Logic sequence (e.g., a Boot Logic procedure) may be delayed until the junction temperature reaches the warmer value of −30° C. and the ext_reset signal 401 is de-asserted. When the boot_en signal 419 is asserted, the timing path for the Boot Logic sequence (e.g., that may be used to initiate the one or more processors of the IC) at the Boot Logic 418 may be initiated. In certain configurations, the boot_en signal 419 may be asserted for multiple clock cycles. In certain other configurations, the Boot Logic 418 may be designed such that once the boot_en signal 419 is asserted, the Boot Logic 418 carries out the entire boot sequence to initiate the one or more processors of the IC even if the boot_en signal 419 is de-asserted during the Boot Logic sequence.

The Boot Logic sequence may also be described similarly for waking from a sleep mode. The sleep mode may differ from cold start or reset in that the external power rails may already be stable, and many of the IC's resources may be initialized. For example, when the IC is included in wireless devices, e.g., such as a Wi-Fi device, BT device, or BLE device, sleep modes may be entered and exited regularly to periodically check for over the air beacons, page scans, or advertising packets. Hence, depending on the intervals of time during which the wireless device is in sleep mode, the IC may transition to a wake mode by sending a wake signal 421 in order to check for over the air packets (e.g., packets, messages, beacons, etc.). IC resources may include clock generators such as phase locked loops (PLLs), internally generated power supplies, or retained state of flip flops or memory. During a cold boot, IC resources are not initialized, therefore in an unknown state and generally results in the device taking a relatively long time to reach an initialized state. Cold boot is accepted as taking a relatively long time to complete. In sleep mode, the objective may be to put the device in a low power state but maintain some resources, such as internally generated power supplies, clock generators such as PLLs, and retained state of flip flops or memory so that upon wake the device can return to an operating state in a relatively short amount of time relative to cold boot.

However, the overall power dissipation generated during the sleep mode may be relatively low, and hence, the junction temperature of the IC may drop near the ambient temperature (e.g., e.g., −40° C.) that may be lower than the threshold value (e.g., −30° C.). In other words, when the IC enters sleep mode, the IC may be subject to the same or similar procedures described above in connection with the cold start with respect to FIG. 4. In certain implementations, the term "cold boot" may refer to the booting of an IC, or a system, from a non-powered state and does not denote any information related to temperature. The term "cold start" in this disclosure, however, may refer specifically to performing the cold start procedure described above in connection with FIG. 4, e.g., when the wireless device has not been turned on and is at an extremely low temperature.

Figure 5:
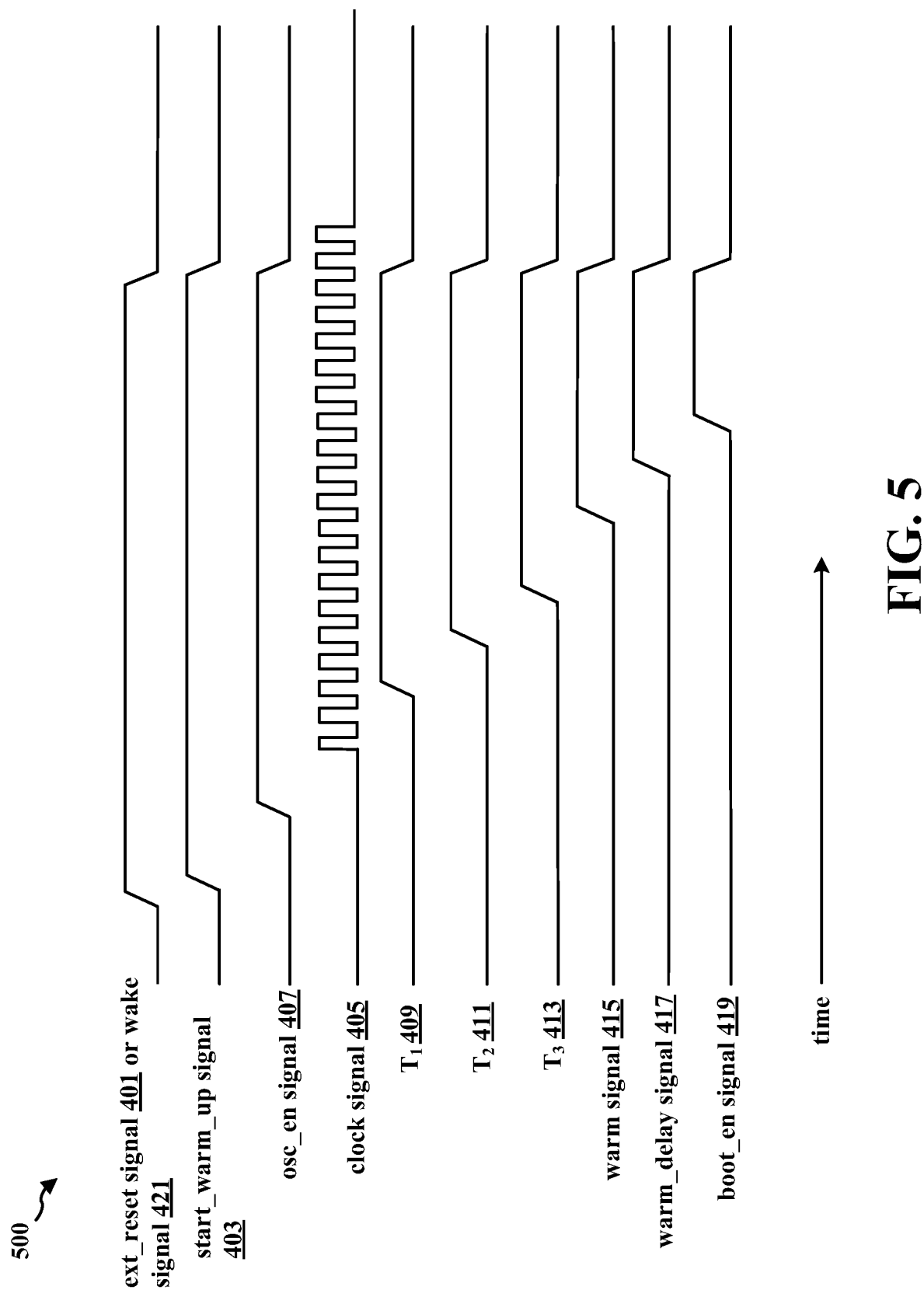
FIG. 5 illustrates a timing diagram that depicts the relative timing of the signals described in connection with FIG. 4.

FIG. 5 illustrates a timing diagram 500 that depicts the relative timing of the ext_reset signal 401, the start_warm_up signal 403, the clock signal 405, the osc_en signal 407, $T_1$ 409, $T_2$ 411, $T_3$ 413, the warm signal 415, the warm_delay signal 417, and the boot_en signal 419 described above in connection with FIG. 4.

Figure 6:
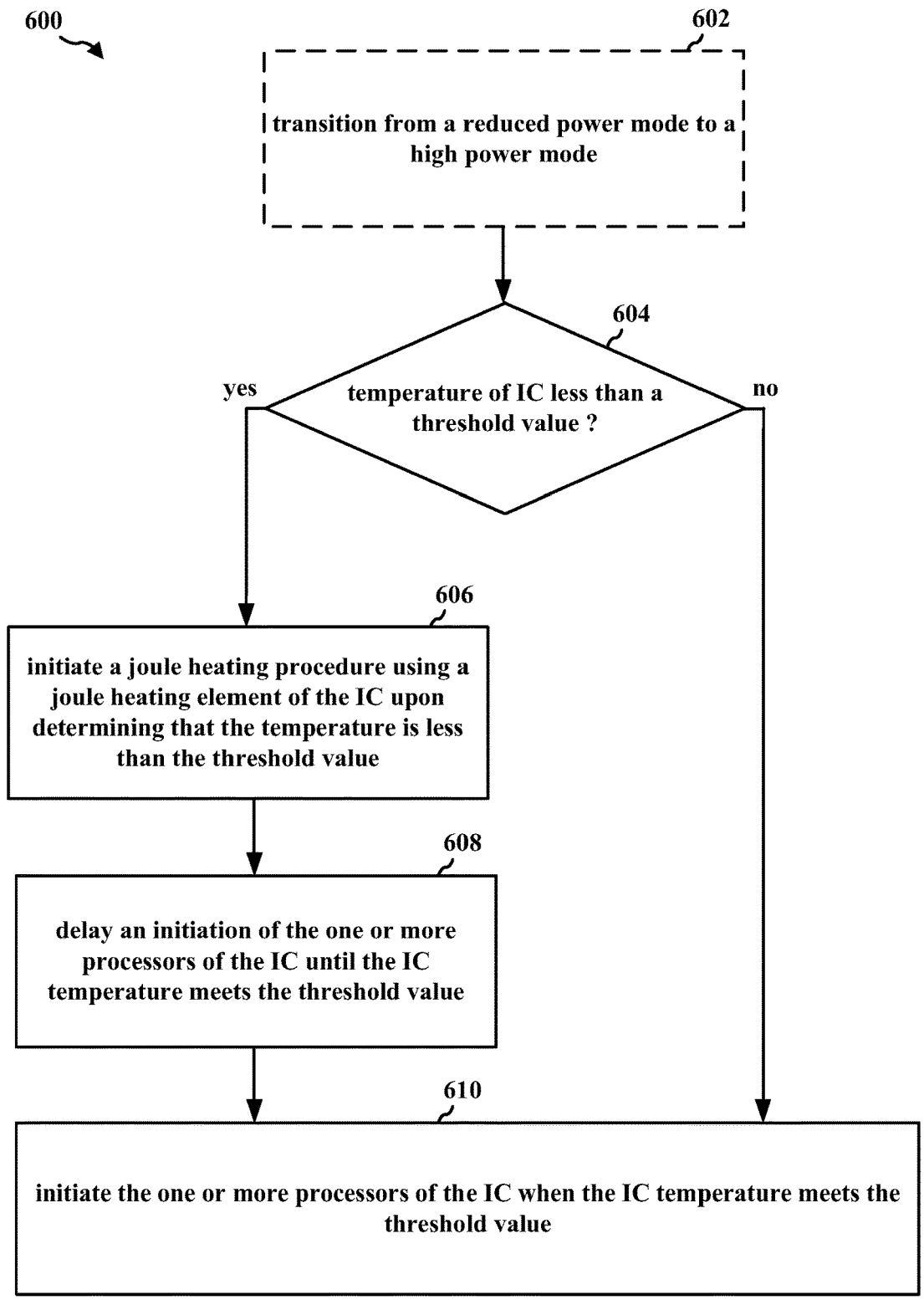
FIG. 6 is a flowchart of a method of wireless or wired communication.

FIG. 6 is a flowchart 600 of a method of for delaying a Boot Logic sequence until a temperature of an IC meets a threshold value in accordance with certain aspects of the disclosure. The method may be performed by an IC included in a wireless device or a wired device, e.g., the central device 102, peripheral device 104, 106, 108, 110, 112, 114, wireless device 200, the apparatus 702/702'. In FIG. 6, optional operations are indicated with a dashed line.

At 602, the IC may transition from a reduced power mode to a fully operational mode. In certain aspects, the IC may transition from the reduced power mode to the fully operational mode upon receiving an external reset signal. For example referring to FIG. 4, the ext_reset signal 401 may be asserted in order to transition the IC from a reduced power mode (e.g., from a cold start to a fully operational mode or transitioning from sleep mode to fully operational mode). The example illustrated in FIG. 4 uses the ext_reset signal 401 as the first signal precipitating a response from the IC, but a similar example may be described using a wake signal 421 to take the underlying circuit out of sleep mode. Any event that causes the IC to transition from a low power state under which the junction temperature is at or below −40° C. to a high power state during which the temperature may be able to rise to or above, e.g., −30° C. The value of −40° C. (e.g., the cold value) described in connection with FIG. 4 is used as an example and should not be construed in a limiting sense. The cold value may be any practical value of interest.

At 604, the IC may determine whether the temperature is less than a threshold value. For example, referring to FIG. 4, any event that causes the IC to transition from a low power state when the junction temperature is at or below −40° C. (e.g., as determined by the by the comparator 412) to a high power state (e.g., eventually a fully operation state when the junction temperature reaches the threshold value and the one or more processors are booted on) during which the temperature may be able to rise to or above, e.g., −30° C. The value of −30° C. described in connection with FIG. 4 is also used as an example and should not be construed in a limiting sense. The warm value may be any practical value of interest.

Upon determining at 604 that the temperature is not less than a threshold value, the operation may continue to block 610. Conversely, upon determining at 604 that the temperature is less than a threshold value, the operation may continue to block 606.

At 606, the IC may initiate a joule heating procedure using a joule heating element upon determining that the temperature is less than the threshold value. In certain aspects, the joule heating element may include one or more of at least one transistor or at least one resistor. In certain aspects, the joule heating procedure may be initiated upon receiving a start warm up signal, and the start warm up signal may be used to initiate one or more of a counter or state machine associated with the IC. In certain other aspects, an oscillator may be enabled upon receiving an oscillator enable signal, and the oscillator may output at least one clock signal when the oscillator is enabled. In certain other aspects, the oscillator may output at least one clock signal when the oscillator is enabled. In certain other aspects, the one or more of the counter or state machine outputs a first control signal to a temperature sensor, a second control signal to a temperature comparator, and a third control signal to the D flip flop to enable the D flip flop to assert a warm delay signal and de-assert the start warm up signal when the temperature comparator determines that the temperature meets the threshold value. In certain other aspects, the comparator may send a warm signal to the D flip flop upon determining that the temperature meets the threshold value. In certain other aspects, the comparator may send a warm signal to the D flip flop upon determining that the temperature meets the threshold value. The joule heating procedure may begin with sending the ext_reset signal 401 and follow the operations described above with reference to the start_warm_up signal 403, the clock signal 405, the osc_en signal 407, $T_1$ 409, $T_2$ 411, $T_3$ 413, the warm signal 415, the warm_delay signal 417, the boot_en signal 419, the SR flip flop 402 (prior to the SR flip flop 402 sending the boot_en signal 419 to the Boot Logic 418), the Counter and State Machine 404, the Heater Logic and Resistors 406, the oscillator 408, the temperature sensor 410, the temperature comparator 412, the D flip flop 414, and the OTP storage or fuses 416 described above in connection with FIG. 4 in connection with FIG. 4.

At 608, the IC may delay an initiation of the one or more processors of the IC until the temperature meets the threshold value. In certain aspects, a set input and reset input (SR) flip flop sends a boot enable signal to boot logic upon receiving the warm delay signal from the comparator. For example, referring to FIG. 4, the ext_reset signal 401 may be used as the first signal to precipitate a response (e.g., initiating the joule heating procedure) from the IC, but a similar example may be described using a wake signal 421 to take the underlying IC out of sleep mode. Any event that causes the IC to transition from a low power state when the junction temperature is at or below −40° C. (e.g., as determined by the comparator 412) to a high power state (e.g., eventually a fully operation state when one or more processors of the IC are booted on) causing the temperature to rise to or above, e.g., −30° C. may be considered a response (e.g., initiating the joule heating procedure) from the IC.

At 610, the IC may initiate the one or more processors of the IC when the temperature meets the threshold value. In certain other aspects, the one or more processors may be initiated by the boot logic upon receiving the warm delay signal from the SR flip flop. For example, referring to FIG. 4, the ext_reset signal 401 may be de-asserted to signal to the CPU (not illustrated in FIG. 4) to retrieve the boot vector that is used to implement the Boot Logic sequence for the one or more processors of the IC by the Boot Logic 418. In other words, the Boot Logic sequence (e.g., a Boot Logic procedure) may be delayed until the junction temperature reaches the warmer value of −30° C. and the ext_reset signal 401 is de-asserted. When the boot_en signal 419 is asserted, the timing path for the Boot Logic sequence (e.g., that may be used to initiate the one or more processors of the IC) at the Boot Logic 418 may be initiated. In certain configurations, the boot_en signal 419 may be asserted for multiple clock cycles. In certain other configurations, the Boot Logic 418 may be designed such that once the boot_en signal 419 is asserted, the Boot Logic 418 carries out the entire boot sequence to initiate the one or more processors of the IC even if the boot_en signal 419 is de-asserted during the Boot Logic sequence.

Figure 7:
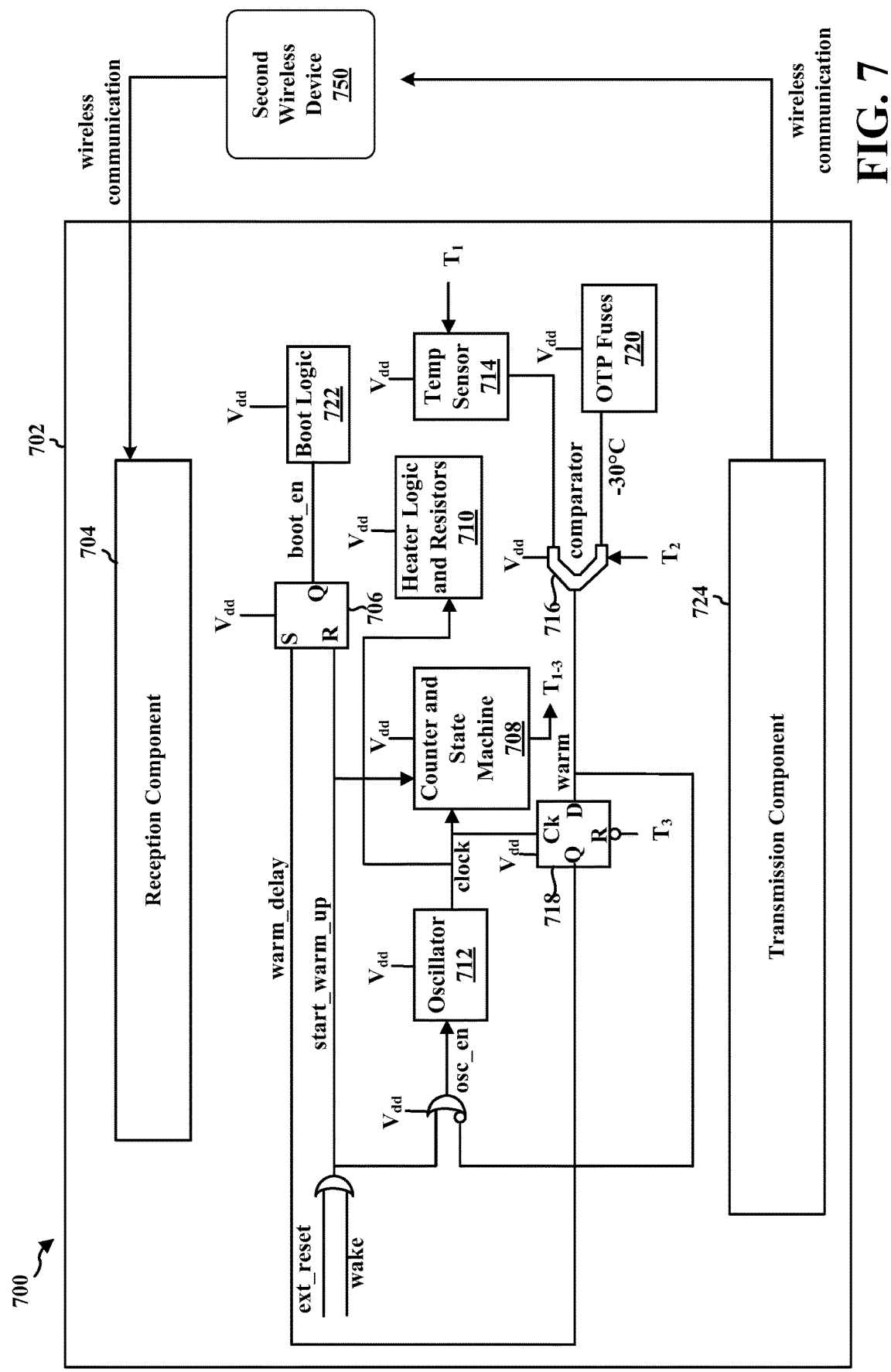
FIG. 7 is a conceptual data flow diagram illustrating the data flow between different means/components in an exemplary apparatus.

FIG. 7 is a conceptual data flow diagram 700 illustrating the data flow between different means/components in an exemplary apparatus 702. The apparatus 702 may be an IC included in, e.g., a wireless device or a non-wireless device that may communicate with a second device 750 (e.g., central device 102, peripheral device 104, 106, 108, 110, 112, 114, wireless device 200). The apparatus may include a reception component 704, an SR flip flop component 706, a Counter and State Machine component 708, a Heater Logic and Resistors component 710, an oscillator component 712, a temperature sensor component 714, a temperature comparator component 716, a D flip flop component 718, an OTP storage or fuses component 720, a Boot Logic component 722, and a transmission component 724.

In certain aspects, the apparatus 702 may be configured to transition from a reduced power mode to a fully operational mode. In certain aspects, the IC may transition from the reduced power mode to the fully operational mode upon receiving an external reset signal.

In certain other aspects, the apparatus 702 may be configured to determine whether the temperature is less than a threshold value. For example, the temperature sensor component 714 may send a signal that indicates the temperature to the temperature comparator component 716. The temperature comparator component 716 may be configured to compare the temperature to a threshold value in order to determine whether the temperature does or does not meet the threshold value.

In certain other aspects, the apparatus 702 may be configured to initiate a joule heating procedure using, e.g., the Heating Logic and Resistors component 710 (e.g., a joule heating element) upon determining that the temperature is less than the threshold value. In certain aspects, the joule heating element may include one or more of at least one transistor or at least one resistor. In certain aspects, the joule heating procedure may be initiated upon receiving a start warm up signal, and the start warm up signal may be used to initiate the Counter and State Machine component 708. In certain other aspects, the oscillator component 712 may be enabled upon receiving an oscillator enable signal, and the oscillator component 712 may be configured to output at least one clock signal when the oscillator component 712 is enabled. In certain other aspects, the oscillator component 712 may be configured to output at least one clock signal when the oscillator component 712 is enabled. In certain other aspects, the Counter and State Machine component 708 may output a first control signal (e.g., $T_1$) to the temperature sensor component 714, a second control signal (e.g., $T_2$) to the temperature comparator component 716, and a third control signal (e.g., $T_3$) to the D flip flop component 718. The D flip flop component 718 may be configured to assert a warm delay signal and de-assert the start warm up signal when the temperature comparator component 716 determines that the temperature meets the threshold value (e.g., using the temperature measurement signal from the temperature sensor component 714). In certain configurations, the output of the D flip flop may not impact the start warm up signal, but the IC may be used to assert the warm up signal without compromise of the invention. In certain other aspects, the OTP storage or fuses component 720 may be configured to maintain the threshold value (e.g., −30° C.) that is input to the temperature comparator component 716 for comparison with the temperature measurement signal(s)

from the temperature sensor component 714. In certain other aspects, the temperature comparator component 716 may be configured to send a warm signal to the D flip flop component 718 (e.g., via the D flip flop component 718) upon determining that the temperature meets the threshold value.

In certain other aspects, the apparatus 702 may be configured to delay an initiation of the one or more processors of the apparatus 702 until the temperature meets the threshold value. In certain aspects, the SR flip flop component 706 may be configured to send a boot enable signal to the Boot Logic component 722 upon receiving the warm delay signal from the temperature comparator component 716. In certain other aspects, the Boot Logic component 722 may be configured to enable one or more processors of the apparatus 702 upon receiving the warm delay signal from the SR flip flop component 706.

In certain other aspects, the apparatus 702 may be configured to initiate the one or more processors of the apparatus 702 when the temperature meets the threshold value.

Once the one or more processors are enabled by the Boot Logic component 722, the reception component 704 may be configured to receive one or more wireless communications from the second device 750, and the transmission component 724 may be configured to send one or more control and/or data packets to the second device 750.

The apparatus may include additional components that perform each of the blocks of the algorithm in the aforementioned flowchart of FIG. 6. As such, each block in the aforementioned flowchart of FIG. 6 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 8:
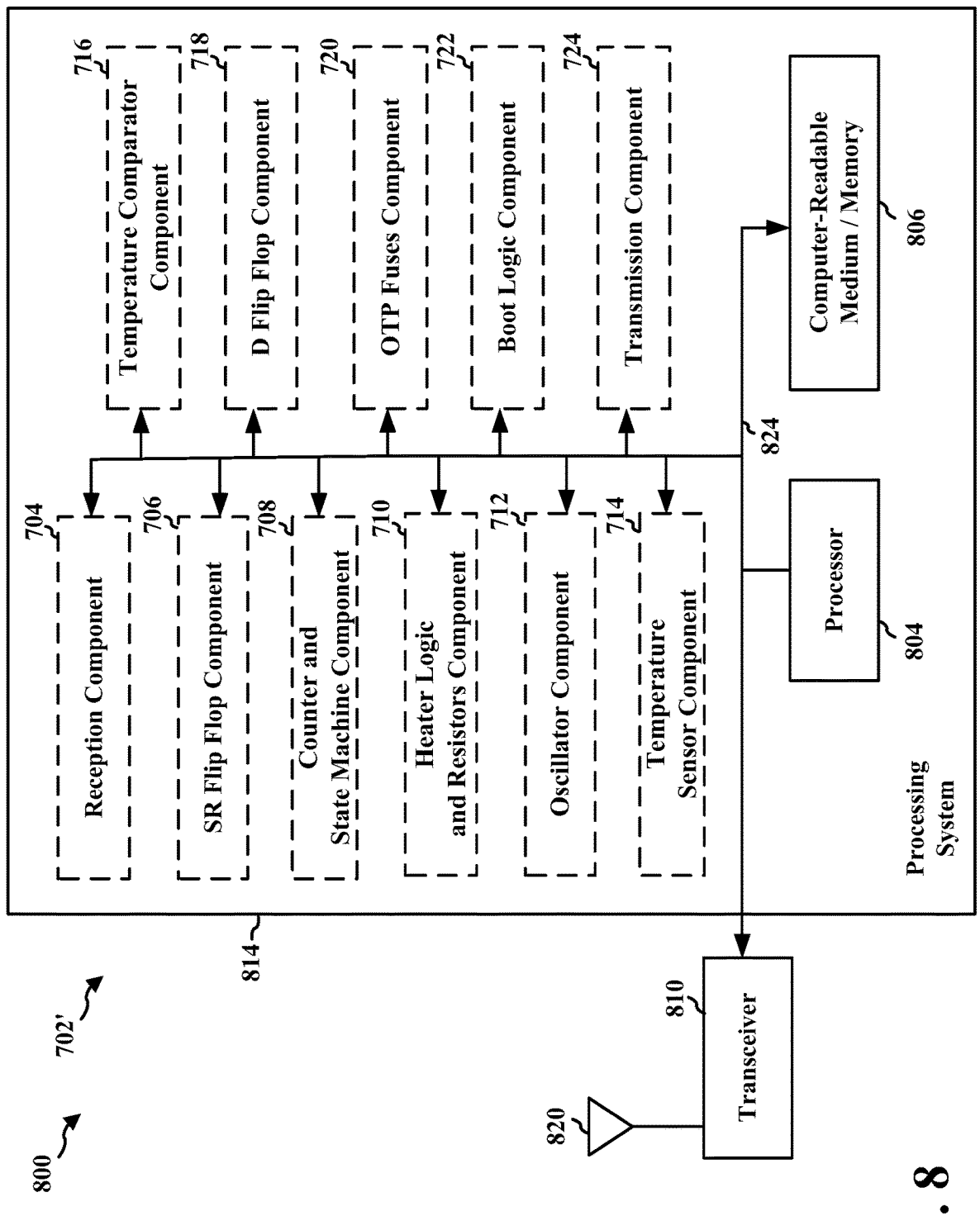
FIG. 8 is a diagram illustrating an example of a hardware implementation for an apparatus employing a processing system.

FIG. 8 is a diagram 800 illustrating an example of a hardware implementation for an apparatus 702' employing a processing system 814. The processing system 814 may be implemented with a bus architecture, represented generally by the bus 824. The bus 824 may include any number of interconnecting buses and bridges depending on the specific application of the processing system 814 and the overall design constraints. The bus 824 links together various circuits including one or more processors and/or hardware components, represented by the processing system 804, the components 704, 706, 708, 710, 712, 714, 716, 718, 720, 722, 724, and the computer-readable medium/memory 806. The bus 824 may also link various other circuits such as timing sources, peripherals, voltage regulators, and power management circuits, which are well known in the art, and therefore, will not be described any further.

The processing system 814 may be coupled to a transceiver 810. The transceiver 810 is coupled to one or more antennas 820. The transceiver 810 provides a means for communicating with various other apparatus over a transmission medium. The transceiver 810 receives a signal from the one or more antennas 820, extracts information from the received signal, and provides the extracted information to the processing system 814, specifically the reception component 704. In addition, the transceiver 810 receives information from the processing system 814, specifically the transmission component 724, and based on the received information, generates a signal to be applied to the one or more antennas 820. The processing system 814 includes a processing system 804 coupled to a computer-readable medium/memory 806. The processing system 804 may be responsible for general processing, including the execution of software stored on the computer-readable medium/memory 806. The software, when executed by the processing system 804, causes the processing system 814 to perform the various functions described supra for any particular apparatus. The computer-readable medium/memory 806 may also be used for storing data that is manipulated by the processing system 804 when executing software. The processing system 814 further includes at least one of the components 704, 706, 708, 710, 712, 714, 716, 718, 720, 722, 724. The components may be software components running in the processing system 804 (e.g., a processor that may be initiated using the signals associated with the joule heating procedure described in connection with FIG. 4 but not other processors of the apparatus 702/702'), resident/stored in the computer readable medium/memory 806, one or more hardware components coupled to the processing system 804, or some combination thereof.

In certain configurations, the apparatus 702/702' for wireless or non-wireless communication may include means for transitioning from a reduced power mode to a fully operational mode. In certain aspects, the apparatus 702/702' may include means for transitioning from the reduced power mode to the fully operational mode upon receiving an external reset signal.

In certain other configurations, the apparatus 702/702' for wireless or non-wireless communication may include means for determining whether the temperature is less than a threshold value. For example, the temperature sensor component 714 may be configured to send a signal that indicates the temperature to the temperature comparator component 716. The temperature comparator component 716 may be configured to compare the temperature to a threshold value in order to determine whether the temperature does or does not meet the threshold value.

In certain other configurations, the apparatus 702/702' for wireless or non-wireless communication may include means for initiating a joule heating procedure using, e.g., the Heating Logic and Resistors component 710 (e.g., a joule heating element) upon determining that the temperature is less than the threshold value. In certain aspects, the joule heating element may include one or more of at least one transistor or at least one resistor. In certain aspects, the joule heating procedure may be initiated upon receiving a start warm up signal, and the start warm up signal may be used to initiate the Counter and State Machine component 708. In certain other aspects, the oscillator component 712 may be configured to be enabled upon receiving an oscillator enable signal, and the oscillator component 712 may output at least one clock signal when the oscillator component 712 is enabled. In certain other aspects, the oscillator component 712 may be configured to output at least one clock signal when the oscillator component 712 is enabled. In certain other aspects, the Counter and State Machine component 708 may be configured to output a first control signal (e.g., $T_1$) to the temperature sensor component 714, a second control signal (e.g., $T_2$) to the temperature comparator component 716, and a third control signal (e.g., $T_3$) to the D flip flop component 718. The D flip flop component 718 may be configured to assert a warm delay signal and de-assert the start warm up signal when the temperature comparator component 716 determines that the temperature meets the threshold value (e.g., using the temperature measurement signal from the temperature sensor component 714). In certain configurations, the output of the D flip flop may not impact the start warm up signal, but the IC may be used to assert the warm up signal without compromise of the invention. In certain other aspects, the OTP storage or fuses component 720 may be configured to maintain the threshold value (e.g., −30° C.) that is input to the temperature comparator component 712 for comparison with the temperature measurement signal(s) from the temperature sensor component 714. In certain other aspects, the temperature comparator component 716 may be configured to send a warm signal to the D flip flop component 718 (e.g., via the D flip flop component 718) upon determining that the temperature meets the threshold value.

In certain other configurations, the apparatus 702/702' for wireless or non-wireless communication may include means for delaying an initiation of the one or more processors of the apparatus 702/702' until the temperature meets the threshold value. In certain aspects, the SR flip flop component 706 may be configured to send a boot enable signal to the Boot Logic component 722 upon receiving the warm delay signal from the temperature comparator component 716. In certain other aspects, the Boot Logic component 722 may be configured to enable one or more processors of the apparatus 702 upon receiving the warm delay signal from the SR flip flop component 706.

In certain other configurations, the apparatus 702/702' for wireless or non-wireless communication may include means for initiating (e.g., the Boot Logic component 722) the one or more processors (e.g., not including the processing system 804) of the apparatus 702/702' when the temperature comparator component 716 determines that the temperature measured by the temperature sensor component 714 meets the threshold value, the temperature comparator component 716 may be configured to send a warm delay signal to the SR flip flop component 706, and the SR flip flop component 706 sends a boot procedure enable signal to the Boot Logic component 722. The aforementioned means may be the processor(s) 202 (e.g., processors that may be initiated using the signals described in connection with the joule heating procedure described in connection with FIG. 4 but not other processors of the apparatus 702/702'), the radio 230, the MMU 240, the WLAN controller 250, the short-range communication controller 252, the WWAN controller 256, and/or a non-wireless communication controller (not illustrated in FIG. 2), one or more of the aforementioned components of the apparatus 702 and/or the processing system 814 (e.g., a processor that may be initiated using the signals associated with the joule heating procedure described in connection with FIG. 4 but not other processors of the apparatus 702/702') of the apparatus 702/702' configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of increasing a temperature of an integrated circuit (IC), the IC including one or more processors, the method comprising:
   determining whether the temperature is less than a threshold value;
   initiating a joule heating procedure using a joule heating element of the IC upon determining that the temperature is less than the threshold value; and
   delaying an initiation of the one or more processors of the IC until the temperature meets the threshold value,
   wherein the determination that the temperature is less than the threshold value is delayed until an expiration of a clock cycle.

2. The method of claim 1, wherein the joule heating element includes one or more of at least one transistor or at least one resistor, the method further comprising:
   transitioning from a reduced power mode to a fully operational mode; and
   initiating the one or more processor of the IC when the temperature meets the threshold value.

3. The method of claim 2, wherein the IC transitions from the reduced power mode to the fully operational mode upon receiving an external reset signal.

4. The method of claim 3, wherein the joule heating procedure is initiated upon receiving a start warm up signal, and wherein the start warm up signal initiates one or more of a counter or state machine associated with the IC.

5. The method of claim 4, wherein an oscillator is enabled upon receiving an oscillator enable signal, and wherein the oscillator outputs at least one clock signal when the oscillator is enabled.

6. The method of claim 5, wherein the one or more of the counter or state machine outputs a first control signal to a temperature sensor, a second control signal to a temperature comparator, and a third control signal to a data (D) flip flop to enable the D flip flop to assert a warm delay signal and de-assert the start warm up signal when the temperature comparator determines that the temperature meets the threshold value.

7. The method of claim 6, wherein the comparator sends a warm signal to the D flip flop upon determining that the temperature meets the threshold value.

8. The method of claim 7, wherein a set input and reset input (SR) flip flop sends a boot enable signal to boot logic upon receiving the warm delay signal from the comparator.

9. The method of claim 8, wherein the one or more processors are initiated by the boot logic upon receiving the warm delay signal from the SR flip flop.

10. An apparatus for increasing a temperature of an integrated circuit IC, the IC including one or more processors, the apparatus comprising:
   means for determining whether the temperature is less than a threshold value;
   means for initiating a joule heating procedure using a joule heating element of the IC upon determining that the temperature is less than the threshold value; and
   means for delaying an initiation of the one or more processors of the IC until the temperature meets the threshold value,
   wherein the determination that the temperature is less than the threshold value is delayed until an expiration of a clock cycle.

11. The apparatus of claim 10, wherein the joule heating element includes one or more of at least one transistor or at least one resistor, the apparatus further comprising:
   means for transitioning from a reduced power mode to a fully operational mode; and
   means for initiating the one or more processor of the IC when the temperature meets the threshold value.

12. The apparatus of claim 11, wherein the IC transitions from the reduced power mode to the fully operational mode upon receiving an external reset signal.

13. The apparatus of claim 12, wherein the joule heating procedure is initiated upon receiving a start warm up signal, and wherein the start warm up signal initiates one or more of a counter or state machine associated with the IC.

14. The apparatus of claim 13, wherein an oscillator is enabled upon receiving an oscillator enable signal, and wherein the oscillator outputs at least one clock signal when the oscillator is enabled.

15. The apparatus of claim 14, wherein the one or more of the counter or state machine outputs a first control signal to a temperature sensor, a second control signal to a temperature comparator, and a third control signal to a data (D) flip flop to enable the D flip flop to assert a warm delay signal and de-assert the start warm up signal when the temperature comparator determines that the temperature meets the threshold value.

16. The apparatus of claim 15, wherein the comparator sends a warm signal to the D flip flop upon determining that the temperature meets the threshold value.

17. The apparatus of claim 16, wherein a set input and reset input (SR) flip flop sends a boot enable signal to boot logic upon receiving the warm delay signal from the comparator.

18. The apparatus of claim 17, wherein the one or more processors are initiated by the boot logic upon receiving the warm delay signal from the SR flip flop.

19. An apparatus for increasing an integrated circuit (IC) temperature of an IC, the IC including one or more processors, the apparatus comprising:
   a memory;
   at least one processor coupled to the memory and configured to:
      determine whether the temperature is less than a threshold value;
      initiate a joule heating procedure using a joule heating element of the IC upon determining that the temperature is less than the threshold value; and
      delay an initiation of the one or more processors of the IC until the temperature meets the threshold value,
   wherein the determination that the temperature is less than the threshold value is delayed until an expiration of a clock cycle.

20. The apparatus of claim 19, wherein the joule heating element includes one or more of at least one transistor or at least one resistor, and wherein the at least one processor is further configured to:
   transition from a reduced power mode to a fully operational mode; and initiate the one or more processor of the IC when the temperature meets the threshold value.

21. The apparatus of claim 20, wherein the IC transitions from the reduced power mode to the fully operational mode upon receiving an external reset signal.

22. The apparatus of claim 21, wherein the joule heating procedure is initiated upon receiving a start warm up signal, and wherein the start warm up signal initiates one or more of a counter or state machine associated with the IC.

23. The apparatus of claim 22, wherein an oscillator is enabled upon receiving an oscillator enable signal, and wherein the oscillator outputs at least one clock signal when the oscillator is enabled.

24. The apparatus of claim 23, wherein the one or more of the counter or state machine outputs a first control signal to a temperature sensor, a second control signal to a temperature comparator, and a third control signal to a data (D) flip flop to enable the D flip flop to assert a warm delay signal and de-assert the start warm up signal when the temperature comparator determines that the temperature meets the threshold value.

25. The apparatus of claim 24, wherein the comparator sends a warm signal to the D flip flop upon determining that the temperature meets the threshold value.

26. The apparatus of claim 25, wherein a set input and reset input (SR) flip flop sends a boot enable signal to boot logic upon receiving the warm delay signal from the comparator.

27. The apparatus of claim 26, wherein the one or more processors are initiated by the boot logic upon receiving the warm delay signal from the SR flip flop.

28. A computer-readable medium comprising computer executable code configured to increase a temperature of an integrated circuit (IC), the IC including one or more processors, the computer-readable medium comprising code to:
   determine whether the temperature is less than a threshold value;
   initiate a joule heating procedure using resistor joule heating element of the IC upon determining that the temperature is less than the threshold value; and
   delay an initiation of the one or more processors of the IC until the temperature meets the threshold value,
   wherein the determination that the temperature is less than the threshold value is delayed until an expiration of a clock cycle.

29. The computer-readable medium of claim 28, wherein the joule heating element includes one or more of at least one transistor or at least one resistor, further comprising code to:

transition from a reduced power mode to a fully operational mode; and initiate the one or more processor of the IC when the temperature meets the threshold value.

30. The computer-readable medium of claim 29, wherein the IC transitions from the reduced power mode to the fully operational mode upon receiving an external reset signal.

31. The computer-readable medium of claim 30, wherein the joule heating procedure is initiated upon receiving a start warm up signal, and wherein the start warm up signal initiates one or more of a counter or state machine associated with the IC.

32. The computer-readable medium of claim 31, wherein an oscillator is enabled upon receiving an oscillator enable signal, and wherein the oscillator outputs at least one clock signal when the oscillator is enabled.

33. The computer-readable medium of claim 32, wherein the one or more of the counter or state machine outputs a first control signal to a temperature sensor, a second control signal to a temperature comparator, and a third control signal to a data (D) flip flop to enable the D flip flop to assert a warm delay signal and de-assert the start warm up signal when the temperature comparator determines that the IC temperature meets the threshold value.

34. The computer-readable medium of claim 33, wherein the comparator sends a warm signal to the D flip flop upon determining that the IC temperature meets the threshold value.

35. The computer-readable medium of claim 34, wherein a set input and reset input (SR) flip flop sends a boot enable signal to boot logic upon receiving the warm delay signal from the comparator.

36. The computer-readable medium of claim 35, wherein the one or more processors are initiated by the boot logic upon receiving the warm delay signal from the SR flip flop.

* * * * *